US011600932B2
US 11,600,932 B2

(12) United States Patent
Tang et al.

(10) Patent No.: US 11,600,932 B2
(45) Date of Patent: Mar. 7, 2023

(54) ANTENNA-ON-PACKAGE INCLUDING MULTIPLE TYPES OF ANTENNA

(71) Applicant: Texas Instruments Incorporated, Dallas, TX (US)

(72) Inventors: Yiqi Tang, Allen, TX (US); Rajen Manicon Murugan, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 160 days.

(21) Appl. No.: 17/232,849

(22) Filed: Apr. 16, 2021

(65) Prior Publication Data

US 2021/0328367 A1 Oct. 21, 2021

Related U.S. Application Data

(60) Provisional application No. 63/011,301, filed on Apr. 17, 2020.

(51) Int. Cl.
*H01Q 1/22* (2006.01)
*H01Q 23/00* (2006.01)
*H01L 23/66* (2006.01)

(52) U.S. Cl.
CPC ............ *H01Q 23/00* (2013.01); *H01L 23/66* (2013.01); *H01Q 1/2283* (2013.01)

(58) Field of Classification Search
CPC .. H01Q 23/00; H01Q 1/2283; H01Q 1/24–38; H01L 23/66; H01L 2223/6677
See application file for complete search history.

(56) References Cited

U.S. PATENT DOCUMENTS

| 8,033,014 | B2 | 10/2011 | Yu et al. | |
|---|---|---|---|---|
| 11,424,195 | B2* | 8/2022 | Shaul | H01Q 1/2283 |
| 11,424,197 | B2* | 8/2022 | Wang | H01L 24/16 |
| 2020/0176376 | A1* | 6/2020 | Ndip | H01L 24/48 |

OTHER PUBLICATIONS

Stefan Wiktor, HotRod QFN Package PCT Attachment, Texas Instruments Application Report, Printed Circuit Board (PCB) Design Guidelines; SLUA715—May 2014; pp. 11.

* cited by examiner

*Primary Examiner* — Hasan Islam
(74) *Attorney, Agent, or Firm* — Ronald O. Neerings; Frank D. Cimino

(57) ABSTRACT

An AIP includes a package substrate including a top layer including a top metal layer including a first antenna type and a second antenna type, and a bottom layer including a bottom dielectric and a metal layer including a first and second contact pad and filled vias, and an IC embedded therein. Bond pads of an IC are coupled by a connection including ≥1 filled via for connecting to the top and/or bottom metal layer. A first metal pillar is between the first contact pad and first antenna, and a second metal pillar is between the second contact pad and second antenna. A first filled via is coupled to the first metal pillar providing a transmission line from the first contact pad to the first antenna. A second filled via is coupled to the first metal pillar providing a transmission line from the second contact pad to the second antenna.

20 Claims, 9 Drawing Sheets

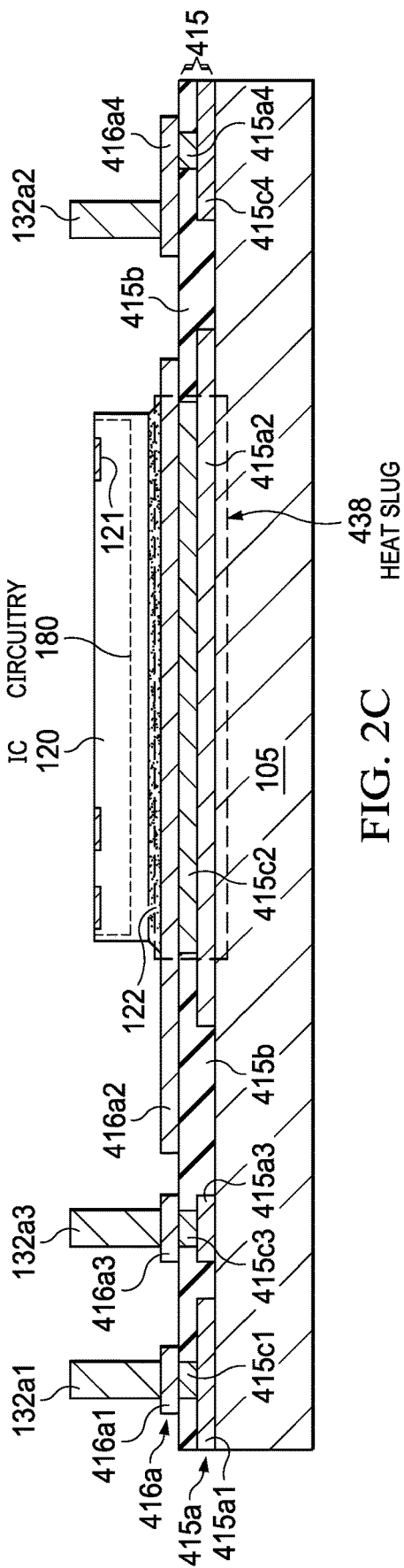
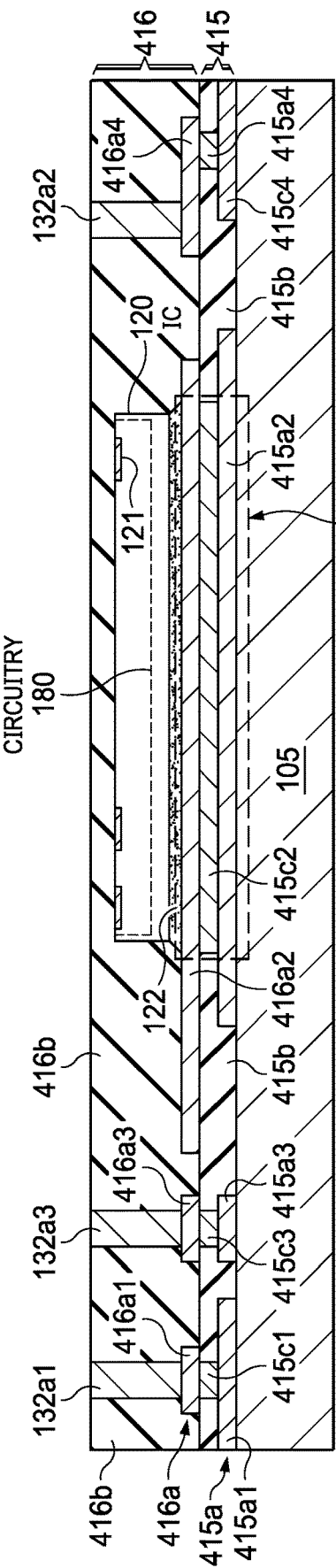
FIG. 2C
FIG. 2D

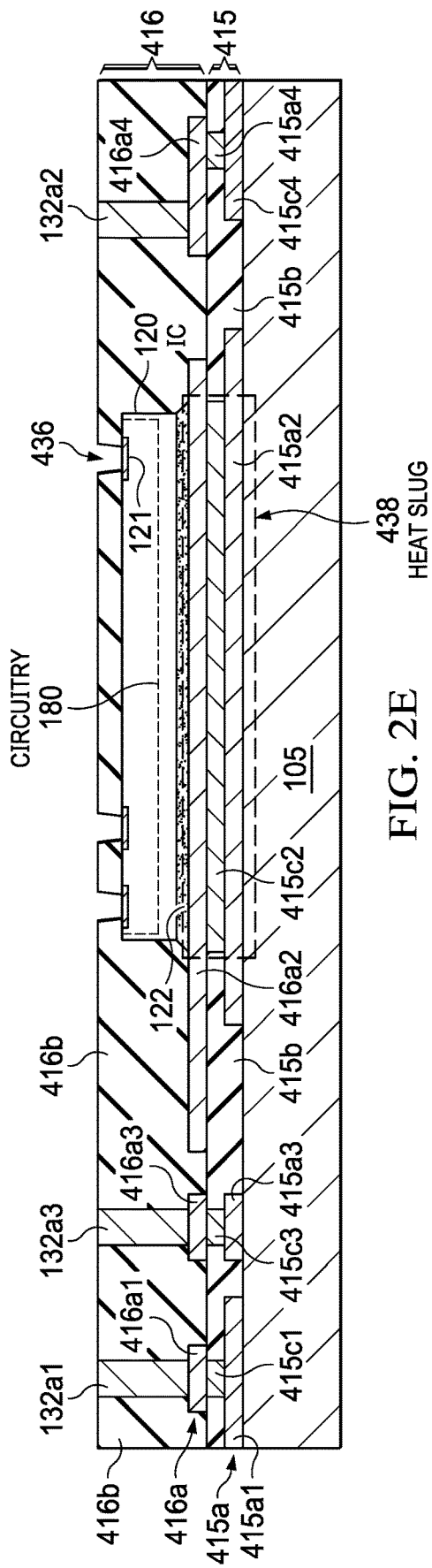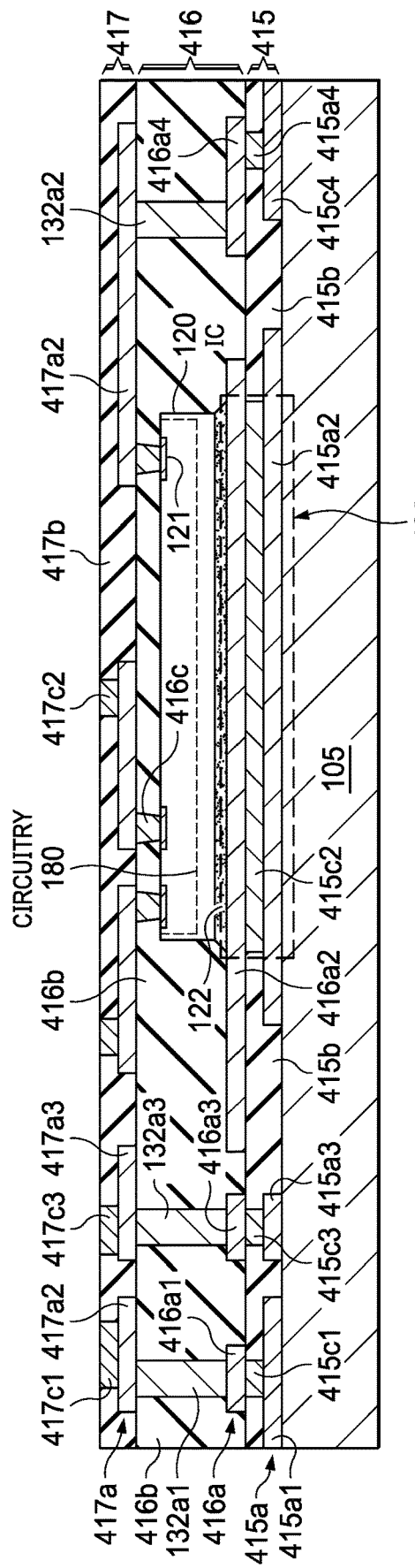
FIG. 2E
FIG. 2F

ANTENNA-ON-PACKAGE INCLUDING MULTIPLE TYPES OF ANTENNA

CROSS REFERENCE TO RELATED APPLICATIONS

This application claims the benefit of Provisional Application Ser. No. 63/011,301 entitled "Antenna-on-Package Structures using embedded-Routable-Leadframe (eRLF) Technology", filed on Apr. 17, 2020, which is herein incorporated by reference in its entirety.

CROSS-REFERENCE TO COPENDING APPLICATIONS

This application has subject matter related to copending application Ser. No. 17/138,557 entitled "ANTENNA IN PACKAGE HAVING ANTENNA ON PACKAGE SUBSTRATE" that was filed on Dec. 30, 2020.

FIELD

This Disclosure relates to packaged semiconductor devices known as an antenna in package (AIP) which include at least one integrated circuit (IC) die and an antenna.

BACKGROUND

AIP is a semiconductor package arrangement where the antenna is integrated into the package along with IC(s) die generally including a radio frequency (RF) IC die to provide a wireless device. In this configuration, the antenna is not a separate component placed within the wireless device but is instead directly integrated into the package along with other IC(s) die. This approach is sometimes referred to as a discrete antenna approach. Other typical AIP components may include RF/millimeter (mm) wave building blocks, an analog baseband signal chain for transmitters and receivers, as well as a customer-programmable microcontroller unit (MCU) and a digital signal processor (DSP).

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize a conventional AIP is implemented using an organic ball grid array (BGA) substrate. Conventional organic substrates comprise small organic molecules. Small organic molecules typically comprise polycyclic aromatic compounds, such as pentacene, anthracene, and rubrene. While generally able to meet the needed routing complexity, this known AIP arrangement generally has a plurality of drawbacks. Firstly, the antenna to ground plane distance which is recognized to control the radiation pattern produced by the antenna is determined by non-continuous layer thickness stacks. Secondly, it is difficult to implement a high dielectric-constant core for the antenna to reduce the package thickness if desired. Thirdly, the antenna feed transmission line performance can be compromised by monotonous and large size via structures that cannot be tuned or designed to be a good transmission line. Also, the organic substrate generally comprises a moisture absorbent material that results in a delamination risk, where delamination can reduce the moisture shelf life (MSL) which refers to the length of time the product can be kept on the shelf before being mounted in its application in a system.

Disclosed aspects include an AIP comprising a package substrate and an IC die embedded therein that is mounted topside up. The package substrate includes a top layer including a top dielectric and metal layer including a first antenna of a first type and a second antenna of a second type, and a bottom layer including a bottom dielectric and a metal layer including contact pads including a first and second contact pad, and filled vias. Bond pads of the IC die are coupled by a via-comprising die connection including at least one filled via for connecting to the top and/or the bottom metal layer. Metal pillars include a first metal pillar between the first contact pad and the first antenna, and a second metal pillar between the second contact pad and the second antenna. A first filled via is coupled to the first metal pillar providing a transmission line from the first contact pad to the first antenna, and a second filled via is coupled to the second metal pillar providing a transmission line from the second contact pad to the second antenna. Disclosed AIP's by including an antenna at least in part on the top metal layer of the package substrate enables better antenna performance as compared to conventional AIP's, and thus improved AIP performance.

BRIEF DESCRIPTION OF THE DRAWINGS

Reference will now be made to the accompanying drawings, which are not necessarily drawn to scale, wherein:

FIGS. 2A-2G includes successive cross-sectional views of an example assembly flow for a disclosed method of manufacturing the AIP shown in FIG. 1A.

DETAILED DESCRIPTION

Figure 1A:
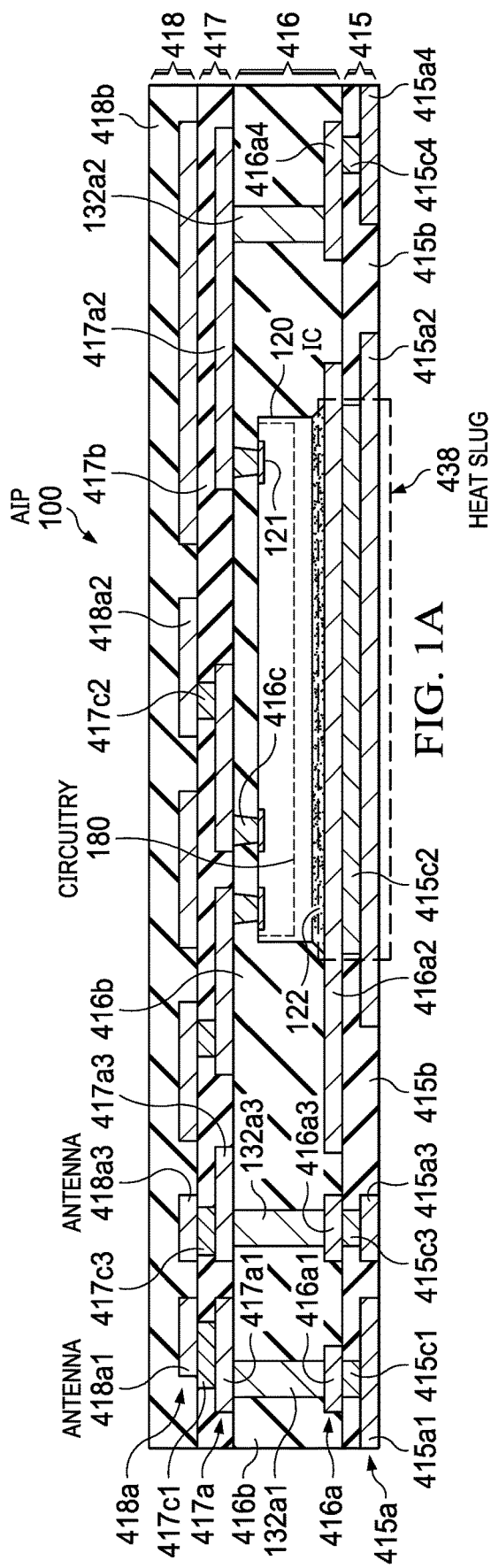
FIG. 1A is a cross-sectional view of example AIP comprising a multilayer package substrate having four layers shown being layer 4 (the top layer) that provides both a first antenna type and a second antenna type, where layer 4 is on layer 3, layer 3 is on layer 2 which is on layer 1 (the bottom layer).

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Several terms used herein will now be defined. A multilayer package substrate for disclosed AIP's is a particular package substrate arrangement that comprises a plurality (at least two) of stacked layers where each layer is pre-configured with metal plating such as copper plating or interconnects to provide electrical connections in the package. Such a package substrate is generally built by forming a dielectric layer such as a mold compound (generally comprising an epoxy material) or other organic compound(s) around a leadframe substrate comprising a metal material between a patterned top metal layer and a patterned metal bottom layer. Such package substrates can comprise single- or multi-die configurations, both lateral and vertically stacked, enabling low-profile, fine-pitch packages, which enable different stackups, material, and manufacturing process, that has recognized benefits when applied to an AIP as described below.

An antenna as used herein comprises a metal comprising a structure which is configured to provide an interface between radio waves propagating through free space and electric currents that flow in the metal conductor of a package substrate, where the antenna is coupled for use with a transmitter and/or a receiver. For disclosed aspects, the respective antennas are generally formed on the top metal layer on the topside of the AIP, with the exception of the Vivaldi antenna that generally involves two metal layers, and there may also be an optional ground plane on a metal layer of the package substrate below the antennas.

An IC die as used herein comprises a substrate having at least a semiconductor surface (generally an all-semiconductor substrate, such as comprising silicon having an optional epitaxial layer thereon), where there were circuit elements (including transistors, and generally diodes, resistors, capacitors, etc.) formed in the semiconductor surface that are configured together for generally realizing at least one circuit function. Various nodes of the circuitry are coupled to bond pads on the topside of the IC, where the bond pads generally comprise the top layer metal. In the case of disclosed AIPs, the IC(s) generally include at least an RF IC.

FIG. 1A is a cross-sectional depiction of an example AIP 100 comprising a multilayer package substrate having four layers shown as layer 4 418 (top layer) on layer 3 417, with layer 3 on layer 2 416, which is on layer 1 415 (bottom layer). Layer 4 418 comprises a metal layer 418a that includes antennas 418a1 and 418a3 and metal traces 418a2, and a dielectric layer 418b. Although not shown in the view provided the dielectric layer 418b can optionally include apertures to expose the top surface of the antennas 418a1 and 418a3 and/or the metal traces 418a2. Although the antennas 418a1 and 418a3 are shown having the shape of microstrip/patch antennas, the antennas 418a1 and 418a3 can alternately comprise other types of antennas including a Vivaldi antenna, a horn antenna, a Yagi-Uda antenna, or a bow-tie antenna. Moreover, an array of the same type of antenna can also be provided such, as an array of patch antennas.

Layer 3 417 comprises a metal layer 417a including metal connectors 417a1 and 417a3 for the respective antennas 418a1 and 418a3, and metal pads 417a2 that as described below provide a portion of the connection to the bond pads 121 connected to selected nodes in the circuitry 180 of the IC 120. Layer 3 417 also includes a dielectric layer 417b. Layer 3 417 comprises filled vias 417c1 and 417c3 that provide a top of the transmission line for the antennas 418a1 and 418a3 as they are positioned directly under the antennas 418a1 and 418a3. There are also filled vias 417c2 that provide a portion of the connection to the bond pads 121 of the IC 120.

Layer 2 416 comprises a metal layer 416a that includes metal layer portion 416a1, and a metal layer portion 416a3, as part of the transmission line for antennas 418a1 and 418a3, respectively, and a metal layer portion referred to as die attach pad 416a2 that is part of the heat slug (or heatsink) 438 under the IC die 120. Metal layer portion 416a4 is part of the connection to the bond pad 121 of the IC die 120. Layer 2 416 also further includes a dielectric layer 416b. Layer 2 416 also includes pillars (such as copper pillars) shown as 132a1 and 132a3 as part of the transmission line for antennas 418a1 and 418a3, respectively, and also a pillar 132a2 as part of the connection to the bond pads 121 of the IC die 120.

Layer 1 415 which can be referred to as a bottom layer comprises a metal layer 415a including a metal layer portion 415a1 and a metal layer portion 415a3 associated with the transmission lines for the antennas 418a1 and 418a3, respectively, metal layer portion 415a2 as part of the heat slug 438, and a metal layer portion 415a4 that is part of the connection to the bond pads 121 of the IC die 120. Layer 1 415 also includes a dielectric layer 415b. Layer 1 415 also comprises filled vias including filled vias 415c1 and 415c3 as part of the transmission line for antennas 418a1 and 418a3, respectively, a filled via area 415c2 that provides a portion of the heat slug 438, and a filled via 415c4 as part of the connection to the bond pads 121 of the IC die 120.

The circuitry 180 on the IC 120 comprises circuit elements (including transistors, and generally diodes, resistors, capacitors, etc.) formed in a substrate comprising at least a top semiconductor layer. For example, the substrate can comprise and epitaxial layer on a bulk substrate material such as silicon.

The bottom side of IC die 120 is attached by a die attach material 122 that is generally both electrically conductive and thermally conductive to the heat slug 438. The IC die 120 is a fully surrounded (or embedded) IC die 120, with the sidewalls of the IC die 120 surrounded by a dielectric layer 416b of a bottom intermediate layer 416, except on its topside by the presence of filled vias 416c that make electrical contact to the bond pads 121 of the IC die 120.

A thickness of disclosed AIP's including AIP 100 can be less than or equal to 600 μm, such as about 450 μm to 500 μm. Generally, any of the above-described dielectric layers can comprise an epoxy material such as an Ajinomoto Build-up Film (ABF) which is known to comprise an epoxy and have a reported dielectric constant ($\varepsilon r$) of 3.1-3.3 with a loss tangent of 0.012. The antennas 418a1 and 418a3 can comprise a millimeter wave antenna, where the millimeter-wave region of the electromagnetic spectrum is commonly defined as the 30 GHz to 300 GHz frequency band, equivalent to the 1 cm to 1 mm wavelength range. The terahertz (THz) band may also be covered by the disclosed antennas.

The IC die 120 can comprise a RF IC die, generally comprising a transceiver including low noise amplifiers, mixers, clock generators, power amplifiers. duplexer and passive components (inductor, capacitor, and transformer). Dimensions including a width and a line spacing for the top metal layer 418a and the bottom metal layer 415a of the package substrate can both include a width and spacing less than or equal to 10 µm, such as 5 µm to 10 µm.

Figure 1B:
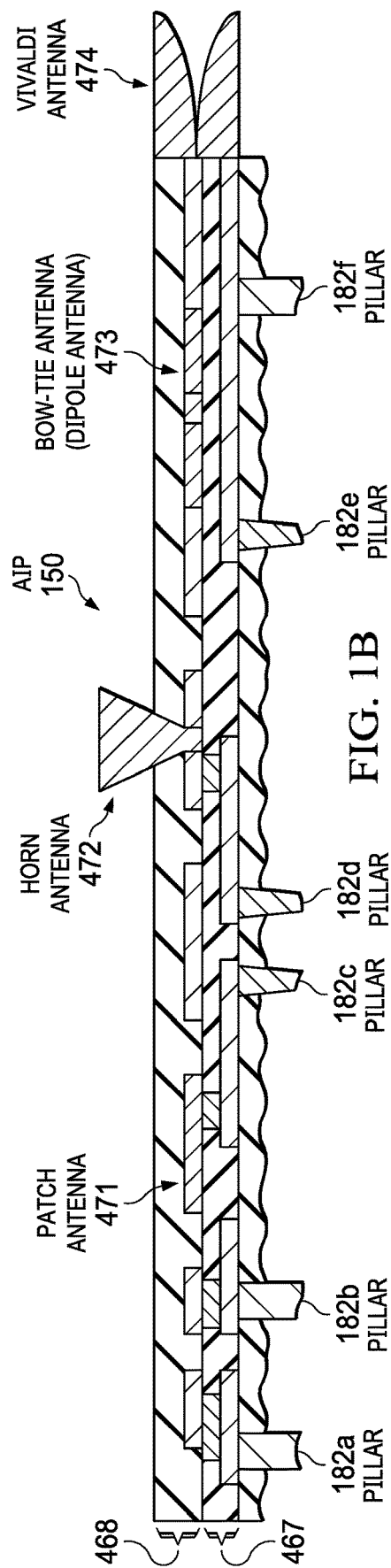
FIG. 1B cross-sectional view of a top portion of example AIP that comprises a multilayer package substrate, showing four different antenna types on the same AIP with the top layer comprising a patch antenna, a horn antenna, a bow-tie (or dipole) antenna, and a Vivaldi antenna. Because only a small top portion of layer 2 is shown in FIG. 1B, only the top of the pillars are shown.
Figure 2A:
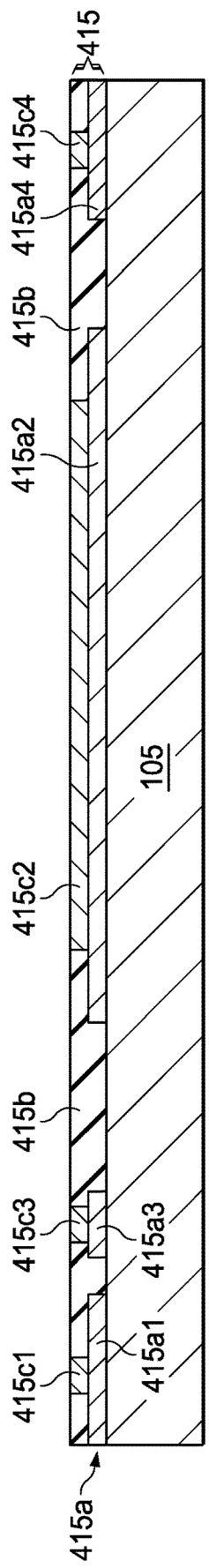

FIG. 1B cross-sectional view of a top portion of example AIP 150 that comprises a multilayer package substrate having four layers, with layer 4 now shown as 468, layer 3 now shown as 467, with the AIP 150 showing four different antenna types. These antenna types shown comprise a patch antenna 471, a horn antenna 472, a bow-tie (or dipole) antenna 473, and a Vivaldi antenna 474. The patch antenna 471, horn antenna 472, and bow-tie (or dipole) antenna 473 are all top emitting, and the Vivaldi antenna 474 is side emitting. Because only a small top portion of the layer 2 is shown in FIG. 1B, only the top of the pillars 182a, 182b, 182c, 182d, 182e, and 182f are shown that are through a dielectric layer, such as the bottom intermediate dielectric layer 416b shown in FIG. 2E described below.

Figure 2B:
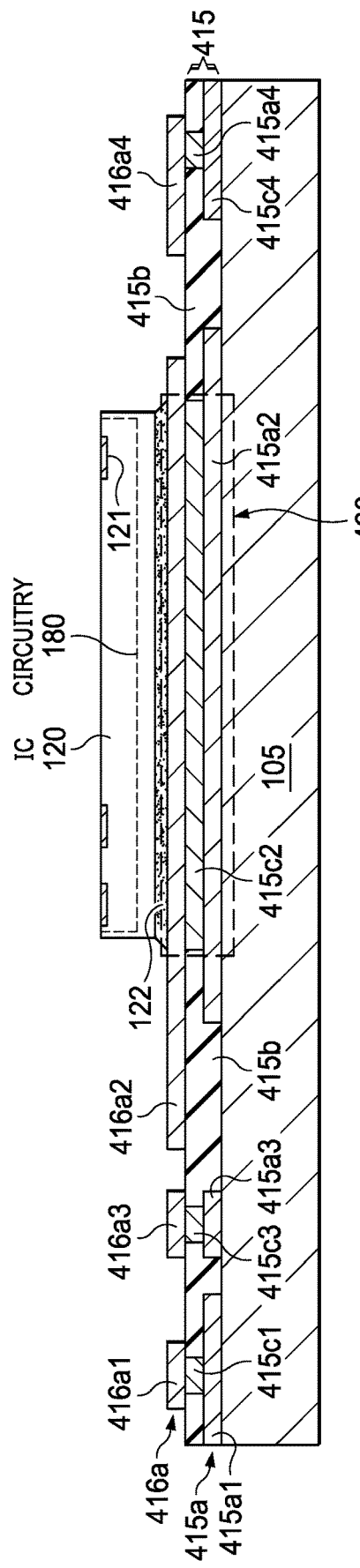

A method for manufacturing an AIP corresponding to AIP 100 described above is now disclosed. The method comprises forming a bottom layer 415 on a carrier 105 including a bottom dielectric layer 415b and a bottom metal layer 415a, and filled vias 415c1-415c4, extending to a topside of the dielectric layer 415b, with the results of forming the bottom layer 415 shown in FIG. 2A. A bottom intermediate metal layer 416a comprising 416a1, 416a2 (providing a die attach pad) 416a3, and 416a4, and a bottom intermediate layer 416, where the features of the bottom intermediate metal layer 416a makes electrically contact to one of the filled vias 415c1-415c4. An IC die 120 is then attached with its topside up onto the die attach pad 416a2, with the results of forming the bottom immediate metal layer 416a and then attaching the IC die 120 shown in FIG. 2B.

A plurality of metal pillar shown as metal pillars 132a1, 132a2, and 132a3 are then formed (e.g., by plating) on respective features of metal layer 416a that extend up to later contact respective features of a below described top intermediate layer 417, with the results shown in FIG. 2C. Molding and then generally grinding forms a bottom intermediate dielectric layer 416b comprising a mold compound that is planar relative to a top of the pillars 132a1, 132a2, 132a3 to expose these pillars, with the results shown in FIG. 2D. Apertures 436 are then formed (such as using laser drilling) through the bottom intermediate dielectric layer 416b to reach the bond pads 121, with the results shown in FIG. 2E.

Figure 2G:
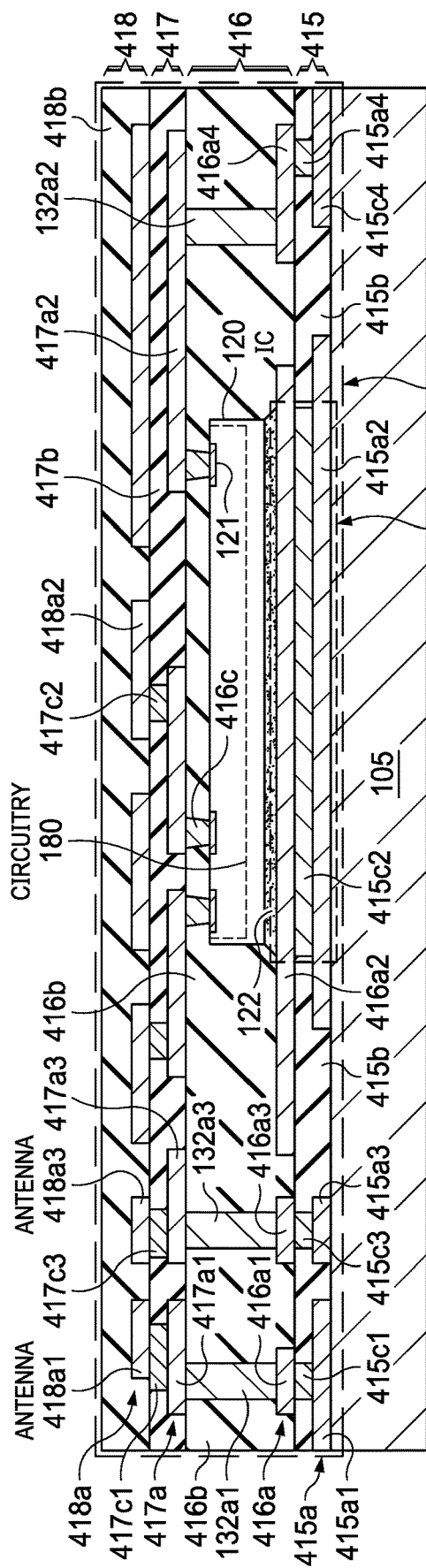

A top intermediate layer 417 is then formed comprising a top intermediate dielectric layer 417b, a top intermediate metal layer 417a and a top intermediate filled vias 417c1-c3, with the results shown in FIG. 2F. A top layer 418 is then formed including a top dielectric layer 418b, a top metal layer 418a including an antenna 418a1 and an antenna 418a3, and metal traces 418a2 that are part of connections including to the filled vias 417c for electrically contacting to the bond pads 121, with the results shown in FIG. 2G which comprises the AIP 100 shown in FIG. 1A on the carrier 105. The carrier 105 is then removed, such as by etching off the carrier 105, which produces AIP 100.

Figure 3:
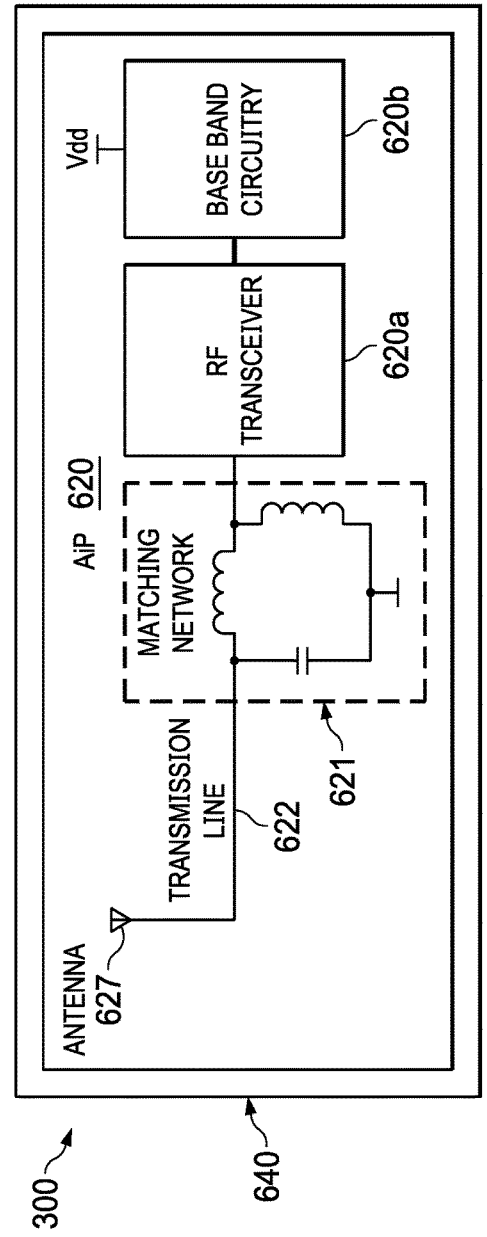
FIG. 3 depicts an application PCB along with a disclosed AIP mounted onto the application PCB.

FIG. 3 depicts an arrangement 300 comprising an application PCB 640 along with a disclosed AIP shown as 620 mounted onto the top surface of the application PCB 640. The AIP 620 is shown including an antenna 627, that is coupled by a transmission line 622 to a matching network 621 that is coupled to an RF transceiver 620a which can comprise an IC or a system-on-a-chip (SOC), which has its outputs coupled to baseband circuitry 620b that can also comprise an IC or a SOC. Although only one antenna 627 is shown for simplicity, as described above there are at least two antennas providing at least two different antenna types for disclosed AIP's.

EXAMPLES

Disclosed aspects are further illustrated by the following specific Examples, which should not be construed as limiting the scope or content of this Disclosure in any way.

Figure 4A:
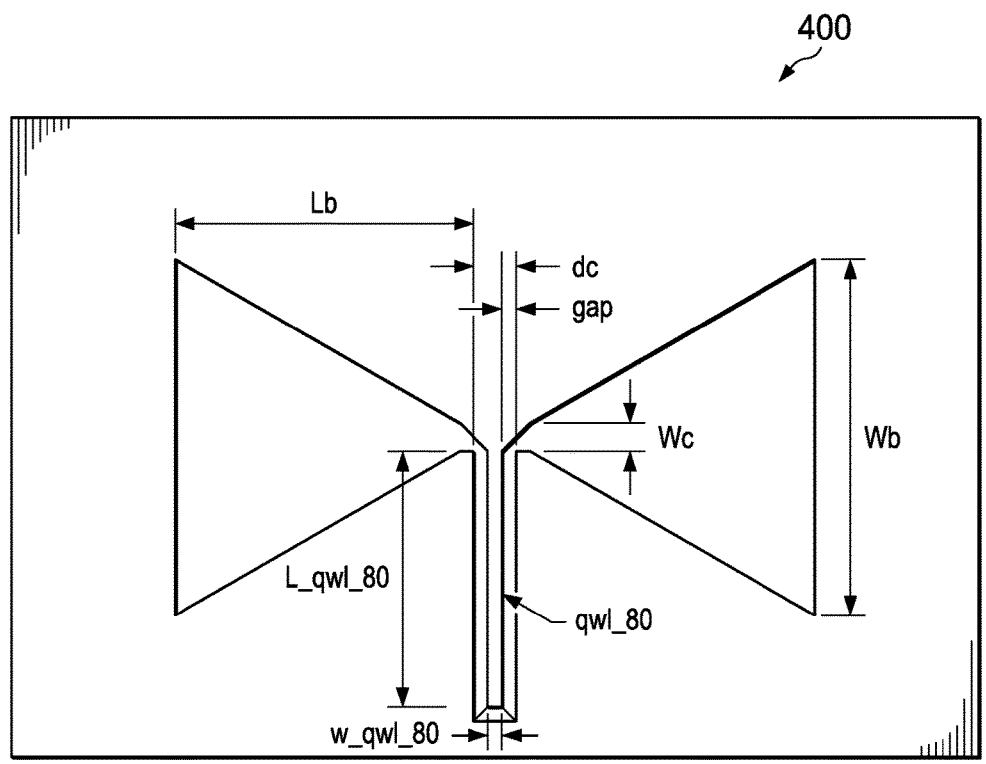
FIG. 4A depicts a top view of an example bow-tie antenna.
Figure 4B:
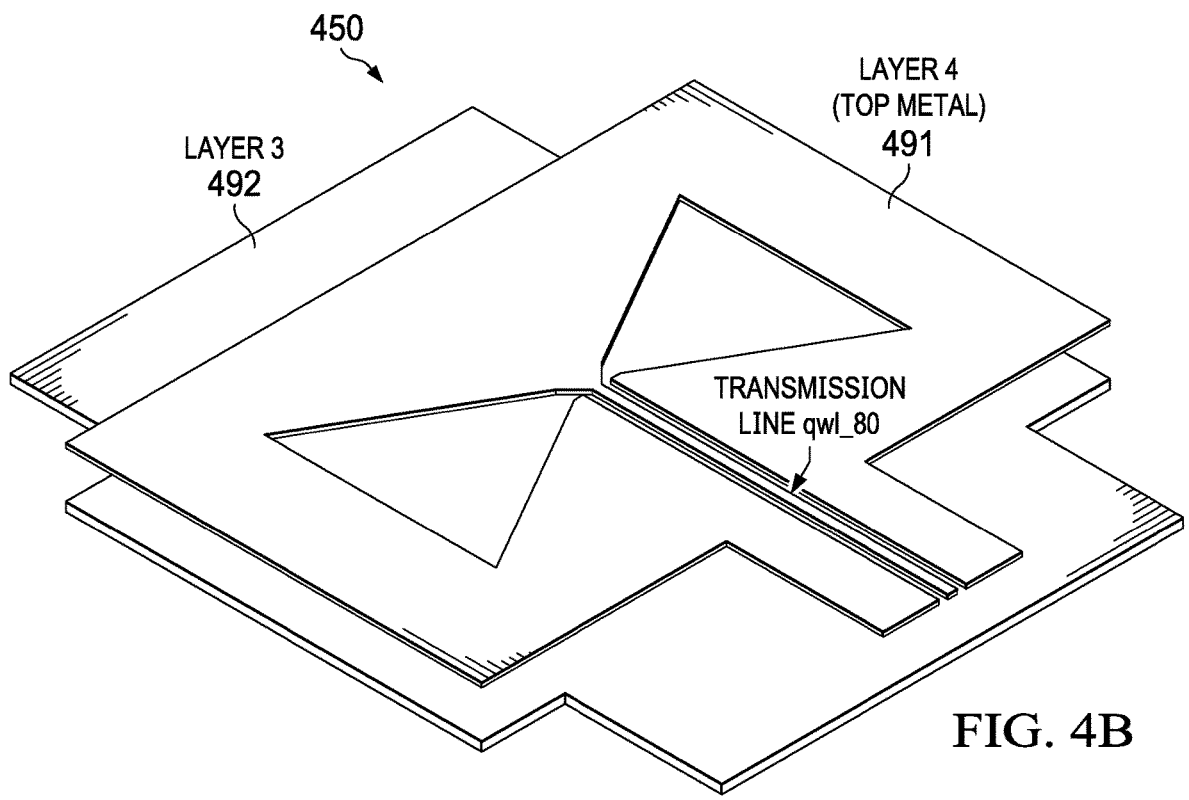
FIG. 4B depicts an example metal layer pattern for the bow-tie antenna.

FIG. 4A depicts a top view of an example bow-tie antenna 400, and FIG. 4B depicts an example metal layer pattern 450 for the bow-tie antenna 400. The bow-tie antenna 400 comprises a feeding transmission line shown as qwl_80, a hollowed bow-tie including apertures all provided by layer 4 (top metal layer) 491, and a ground reflector that is provided on a metal layer that is below the top metal layer shown by example as provided by layer 3 492.

The transmission line qwl_80 is formed in the top metal layer 491 and is electrically isolated from the remainder of the top metal layer 491. Although not shown in these FIGs., the top layer metal 491 is connected in the vertical direction by at least one metal filled via to bond pads on a topside of the IC die. The via connection is made to the bottom of transmission line qwl_80, from the die pad on top of the IC die, that in the AIP is below the bow-tie antenna 400, analogous to that shown for AIP 100 shown in FIG. 1A. Example antenna dimension (in mms) for the bow-tie antenna 400 can be Wb: 0.040, dc: 0.100, 1_qwl_80: 0.382, Wc: 0.360, Lb: 0.440, gap back: 0.027, and w qwl_80: 0.562. These respective dimensions can generally all be varied within a range of plus or minus 20%.

The bow-tie antenna 400 having the dimensions above and the design shown in FIGS. 4A and 4B were found in ANSYS (ANSYS, Inc.) simulation software simulations to provide excellent antenna performance, with an efficiency of 60% to 71% and antenna gain of 3.92 to 6.55 dB in its AIP configuration. This performance was compared to a current published baseline 5G antenna specification (5G mmWave antenna design specification and performance from this Skyworks Solutions, Inc. website: https://www.skyworksinc.com/-/media/SkyWorks/Documents/Articles/IWPC_062019.pdf) that are detailed therein.

Figure 5A:
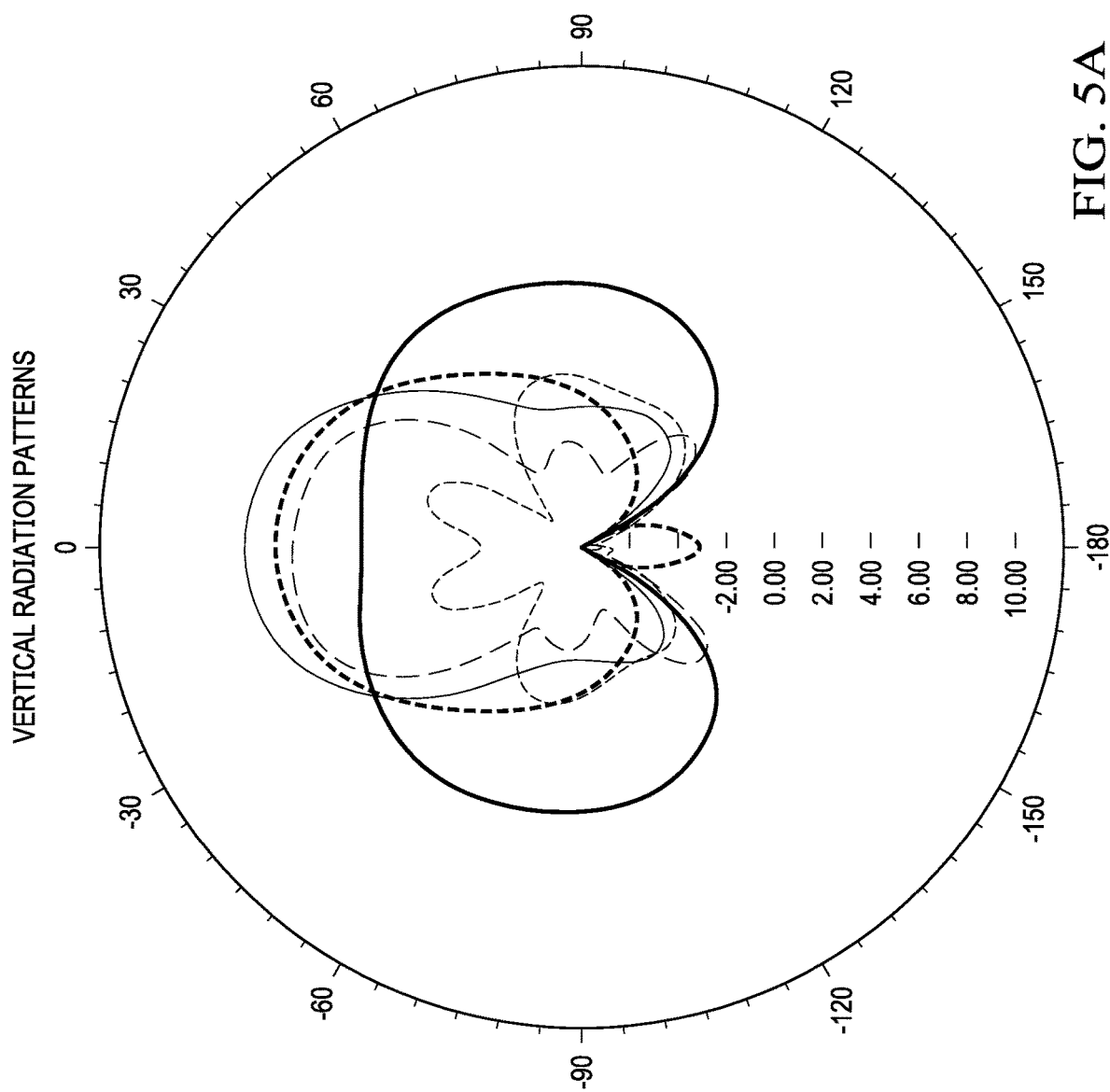
FIGS. 5A and 5B show vertical and horizontal radiation patterns for the bow-tie antenna shown in FIGS. 4A and 4B, respectively.
Figure 5B:
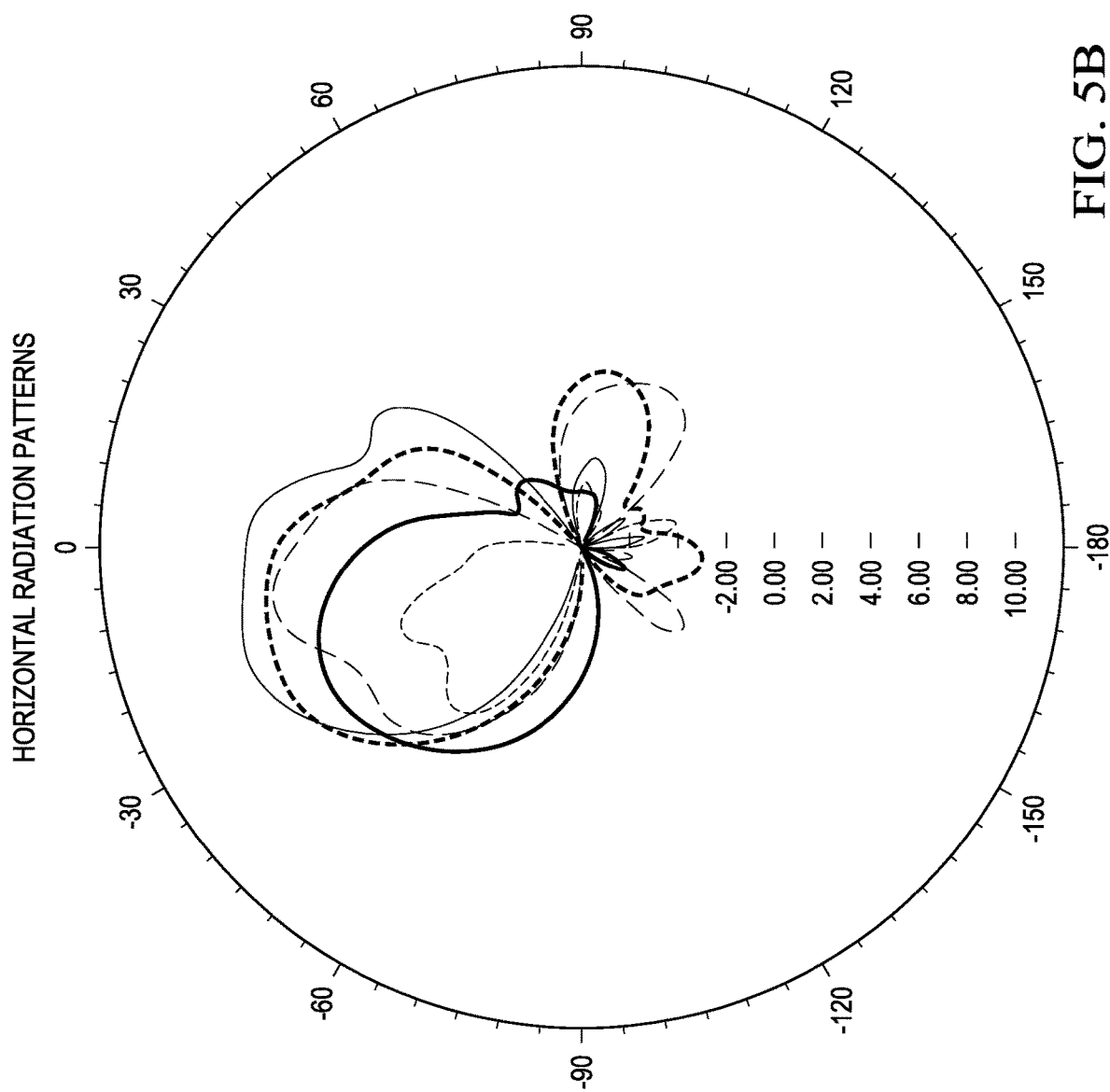
Figure 6:
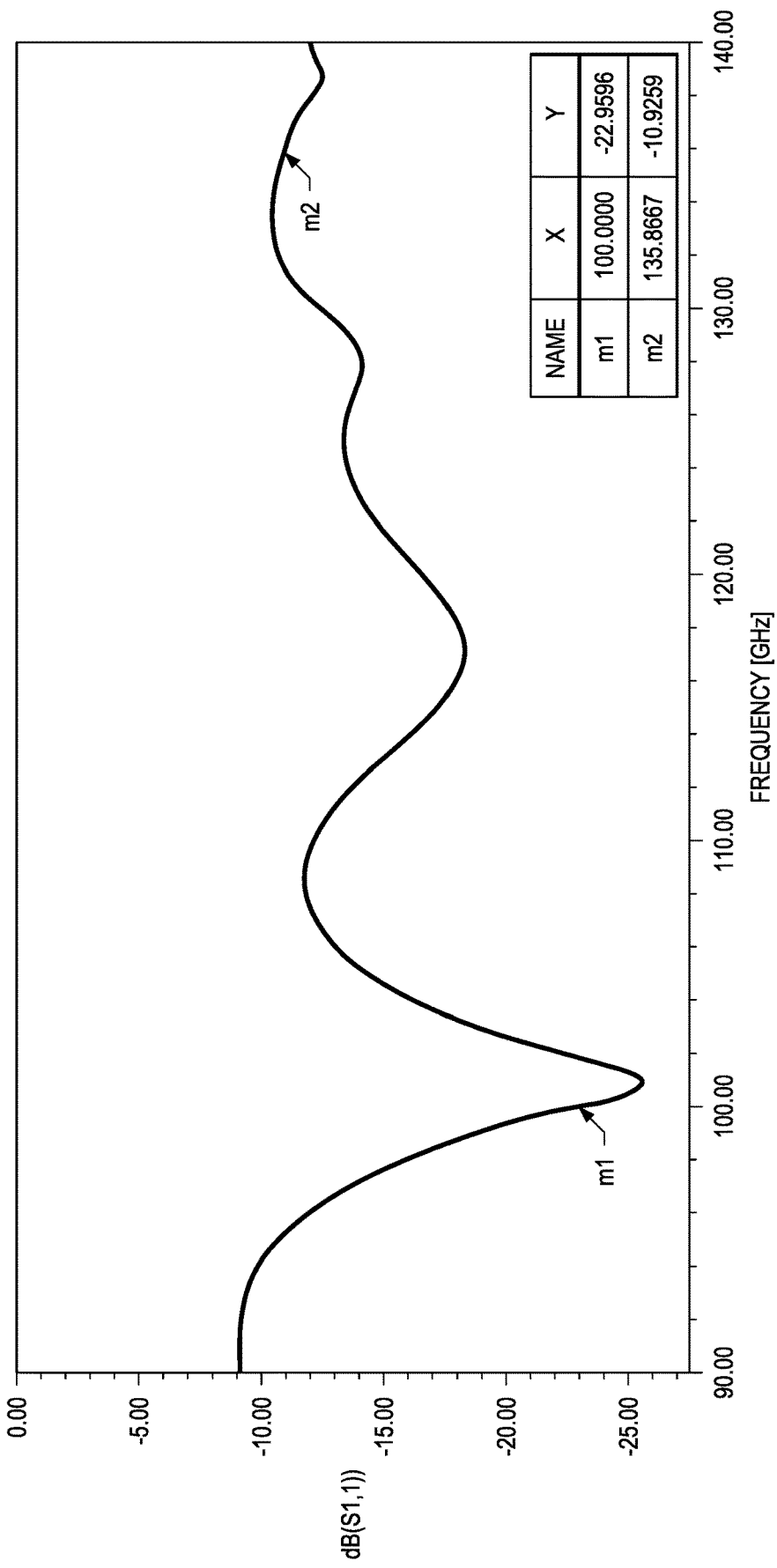
FIG. 6 shows the return loss from 94 GHz to 140 GHz for the bow-tie antenna shown in FIGS. 4A and 4B is below −10 dB, that shows that about 90% of incident power is accepted by the bow-tie antenna.

The vertical and horizontal radiation patterns for the bow-tie antenna 400 are shown in FIGS. 5A and 5B, respectively. The sidelobes can be seen to be minimal, and the coverage to be good from both plots which evidence a well-designed antenna. FIG. 6 shows the return loss from 94 GHz to 140 GHz for the bow-tie antenna 400 is below −10 dB, which shows that about 90% of the incident power received is accepted by the bow-tie antenna 400.

The bow-tie antenna can be manufactured on layer 4 (the top metal layer), and have the same thickness as the top metal layer, where the manufacturing process generally follows the above described method for manufacturing an AIP corresponding to AIP 100. This manufacturing process can comprise layer 4 metal plating according to the designed pattern of bow-tie antenna. The ground reflector for the antenna can be either on layer 3 or layer 2. The process flow for forming the bow-tie antenna can comprise forming the first layer on a carrier by plating and applying a dielectric material, which is then ground to expose the metal connection for electrical connection to be made to layer 4. In one specific configuration the ground reflector can be manufactured using layer 2. The IC die is also mounted while forming layer 2.

Pillars are then formed by plating which provide an electrical connection from layer 2 to layer 3. Over molding then follows with a dielectric material, followed by a grinding process to expose the pillar connections. The connection to the top of the IC die can then be made by laser drilling, and layer 3 and layer 4 are then formed generally using metal plating. The bow-tie antenna can be manufactured by metal plating when layer 4 is built. This same manufacturing process can be applied to form patch antennas and Vivaldi antennas. A Vivaldi antenna uses both layer 3 and layer 4, such as shown as 474 in FIG. 1B described above, while a path antenna generally uses only layer 4. In the case of a horn antenna, the horn antenna can be obtained commercially from a supplier, and then mounted on the top metal layer generally using a soldering process.

Advantages of using a disclosed AIPs comprising a multilayer package substrate include relatively fine design rules and flexibility to develop a family of antennas including different antenna types. For each directivity can be designed in (Low gain and wide field of view (FOV) vs. high gain and narrow FOV), and possible polarization (linear polarization (LP) vs circular polarization (CP antennas)) are all possible. Selectable beam direction (Broadside vs. end-fire) is provided, and generally, any shape vias or pillars are possible, with the capability of a coaxially structured via for the transmission line feed for the antenna to provide reduced insertion loss (IL) and return loss (RL), and to provide better isolation against crosstalk. In the case the vertical connectors comprise pillars, there is provided customizable pillar height providing finer process control as compared to conventional solder ball interconnects. Also, a transmission line with a high dielectric constant dielectric core, can provide benefits of lower insertion loss, higher bandwidth, and can help eliminate substrate modes. Moreover, disclosed AIPs enable a relatively wide antenna bandwidth and relatively high performance, as well as lower cost because disclosed AIPs results in a lower substrate layer count and/or avoidance of conventional expensive AIP solutions.

Having multiple antennas comprising a first antenna of a first antenna type and at least a second antenna of a second type on the same AIP provides additional advantages including i) non-interfering transmission by different antenna types at different bands, ii) having the IC comprise system on Chip (SOC) ICs that target different communication needs such as one antenna for far-end communications needing better directivity and efficiency, and one antenna type for near-end communications needing a smaller antenna size. There can also be boosted signal strength by duplicating the same antenna type to form an antenna array of that antenna type.

Disclosed AIP's thus combine both a cost effective and a high-performance AIP structure into one package solution. Disclosed aspects also provide a flexible option of integrating a low-cost antenna on a leadframe to a standard package (e.g., wirebond, flipchip, wafer fan-out, ball grid array (BGA), quad-flat no lead (QFN), and quad flat package (QFP)).

Disclosed aspects can be integrated into a variety of assembly flows to form a variety of different AIPs and related products. The semiconductor device can comprise single IC die or multiple IC die, such as configurations comprising a plurality of stacked IC die, or laterally positioned IC die. The IC die may include various elements therein and/or layers thereon, including barrier layers, dielectric layers, device structures, active elements, and passive elements including source regions, drain regions, bit lines, bases, emitters, collectors, conductive lines, conductive vias, etc. Moreover, the IC die can be formed from a variety of processes including bipolar, insulated-gate bipolar transistor (IGBT), CMOS, BiCMOS, and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. An antenna in package (AIP), comprising:
an integrated circuit (IC) die comprising a substrate including a top side semiconductor surface including circuitry having a plurality of bond pads electrically connected to nodes in the circuitry;
a package substrate including the IC die mounted with a top side up, wherein the IC die is completely embedded therein, the package substrate comprising a top layer including a top dielectric layer and a top metal layer including a first antenna of a first antenna type and a second antenna of a second antenna type, and a bottom layer including a bottom dielectric layer and a bottom metal layer including a plurality of contact pads including a first contact pad, a second contact pad, and a plurality of filled vias;
the plurality of bond pads electrically coupled by a via-comprising die connection including at least one of the pluralities of filled vias for connecting to at least one of the top metal layer and the bottom metal layer, and
a plurality of metal pillars including a first metal pillar electrically coupled between the first contact pad and the first antenna and a second metal pillar electrically coupled between the second contact pad and the second antenna, and
wherein at least a first of the plurality of filled vias is electrically coupled to the first metal pillar for providing a first transmission line from the first contact pad to the first antenna, and wherein at least a second of the plurality of filled vias is electrically coupled to the first metal pillar for providing a second transmission line from the second contact pad to the second antenna.

2. The AIP of claim 1, wherein the package substrate further comprises:
a top intermediate layer below the top layer including a top intermediate metal layer and a top intermediate dielectric layer, a bottom intermediate layer below the top intermediate layer including a bottom intermediate metal layer and a bottom intermediate dielectric layer, wherein the bottom intermediate dielectric layer surrounds a majority of a surface area of the IC die.

3. The AIP of claim 1, wherein the via-comprising die connection includes ones of the plurality of filled vias including for electrically connecting at least one of the plurality of bond pads to the top intermediate metal layer and then for connecting the top intermediate metal layer to the top metal layer, and other ones of the plurality of filled vias including for electrically connecting the bond pads to the top intermediate metal layer, with the second metal pillar for electrically connecting to at least one of the plurality of contact pads.

4. The AIP of claim 1, wherein the via-comprising die connection includes connecting to both the top metal layer and the bottom metal layer.

5. The AIP of claim 1, further comprising an application printed circuit board (PCB), wherein the AIP is assembled on a top surface of the PCB.

6. The AIP of claim 1, wherein the first antenna and the second antenna both comprise a millimeter wave antenna.

7. The AIP of claim 1, wherein the IC die comprises a radio frequency (RF) die.

8. The AIP of claim 1, wherein a width and a line spacing for the top metal layer and for the bottom metal layer both include a dimension that is less than or equal to 10 μm.

9. The AIP of claim 1, wherein the first antenna and the second antenna collectively include at least two of a patch antenna, a horn antenna, a bow-tie antenna, and a Vivaldi antenna.

10. The AIP of claim 1, wherein a thickness of the AIP is less than or equal to 600 μm.

11. A method of forming an antenna in package (AIP), comprising:
forming a bottom layer on a carrier, the bottom are layer including a bottom metal layer, a bottom dielectric layer, and bottom filled vias on the bottom metal layer, the bottom metal layer providing a plurality of contact pads including a first antenna contact pad, a second antenna contact pad, and a first of the bottom filled vias on the first antenna contact pad and a second of the bottom filled vias over the second antenna contact pad;
forming a bottom intermediate layer comprising a bottom intermediate metal layer, a die pad, and a bottom intermediate metal connector over the first antenna contact pad and another bottom intermediate metal connector over the second antenna contact pad;
attaching to the die pad with a top side of an integrated circuit (IC) die comprising a substrate including a semiconductor surface including circuitry having a plurality of bond pads electrically connected to nodes in the circuitry;
the forming the bottom intermediate layer further comprising forming a plurality of metal pillars on the bottom intermediate metal layer including a first pillar on the bottom intermediate metal connector, a second pillar over the bottom intermediate metal connector, a dielectric layer including above the top side of the IC die, and intermediate filled vias through the dielectric layer that reach the bond pads;
forming a top intermediate layer on the bottom intermediate layer including a top intermediate dielectric layer and a top intermediate metal layer comprising a top intermediate metal on the bottom intermediate metal connector and top intermediate metal on the bottom intermediate metal connector, and a first top filled via on the top intermediate metal and a second top filled via on the top intermediate metal; and
forming a top layer including a top dielectric layer and a top metal layer including a first antenna of a first antenna type on the first top filled via and a second antenna of a second antenna type on the second top filled via.

12. The method of claim 11, wherein the bottom intermediate dielectric layer surrounds a majority of a surface area of the IC die.

13. The method of claim 11, wherein a width and a line spacing for the top metal layer and for the bottom metal layer both include a dimension that is less than or equal to 10 μm.

14. The method of claim 11, wherein the top dielectric layer and the bottom dielectric layer both comprises a composite organic material comprising an epoxy.

15. The method of claim 11, wherein the first antenna and the second antenna both comprise a millimeter wave antenna.

16. The method of claim 11, wherein the first antenna and the second antenna collectively include at least two of a patch antenna, a horn antenna, a bow-tie antenna, and a Vivaldi antenna.

17. The method of claim 11, wherein the via-comprising die connection includes connecting to both the top metal layer and the bottom metal layer.

18. The method of claim 11, wherein a thickness of the AIP is less than or equal to 600 μm.

19. The method of claim 11, wherein the IC die comprises a radio frequency (RF) die.

20. The method of claim 11, wherein the bottom metal layer and bottom intermediate metal layer together provides a metal heat slug positioned beneath a bottom side of the IC die.

* * * * *